(12) United States Patent
Trivedi

(10) Patent No.: US 6,583,060 B2
(45) Date of Patent: Jun. 24, 2003

(54) DUAL DEPTH TRENCH ISOLATION

(75) Inventor: Jigish Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/905,278

(22) Filed: Jul. 13, 2001

(65) Prior Publication Data

US 2003/0013309 A1 Jan. 16, 2003

(51) Int. Cl.$^7$ ............... H01L 21/311; H01L 21/265; H01L 21/425; H01L 21/336; H01L 21/76
(52) U.S. Cl. ............... 438/700; 438/695; 438/524; 438/521; 438/528; 438/529; 438/697; 438/305; 438/306; 438/424; 438/425; 438/426; 438/431; 438/432; 438/439
(58) Field of Search ............... 438/305, 306, 438/424, 425, 426, 431, 432, 439, 521, 528, 529, 697, 700, 524

(56) References Cited

U.S. PATENT DOCUMENTS

| | | | | |
|---|---|---|---|---|
| 4,871,689 A | * | 10/1989 | Bergami et al. ............... 216/19 |
| 5,360,753 A | * | 11/1994 | Park et al. ............... 438/421 |
| 5,451,551 A | * | 9/1995 | Krishnan et al. ............... 216/18 |
| 5,455,194 A | * | 10/1995 | Vasquez et al. ...... 148/DIG. 50 |
| 5,702,870 A | * | 12/1997 | Brugge ............... 430/314 |
| 6,077,733 A | * | 6/2000 | Chen et al. ............... 438/182 |
| 6,190,979 B1 | * | 2/2001 | Radens et al. ............... 438/301 |
| 6,225,646 B1 | * | 5/2001 | Gardner et al. ............... 257/374 |
| 6,294,419 B1 | * | 9/2001 | Brown et al. ............... 438/221 |

2001/0004542 A1 * 6/2001 Woerlee et al. ............. 438/291

FOREIGN PATENT DOCUMENTS

| | | | | |
|---|---|---|---|---|
| JP | 07297273 A | * | 11/1995 | ........... H01L/21/76 |
| KR | 9409365 B1 | * | 10/1994 | ......... H01L/27/092 |
| TW | 274153 A | * | 4/1996 | ......... H01L/27/108 |

OTHER PUBLICATIONS

"A Trench Isolation Technology for High–Speed and Low Power Dissapation Bipolar LSI's", H. Sakai et al., Semiconductor Research Center, Matsushita Electric Industrial Co., Ltd., Moriguchi, Osaka 570, pp. 17–18.

* cited by examiner

Primary Examiner—David Nelms
Assistant Examiner—Ly Duy Pham

(57) ABSTRACT

A dual depth trench isolation structure formed between active devices and conductive well regions of same conductivity type which comprises a first inter-well isolation structure having a first isolation trench depth, a second inter-well isolation structure having a second isolation trench depth which combine to form a dual depth trench containing the dual depth trench isolation structure comprising the first inter-well isolation structure and the second inter-well isolation structure, with the dual depth trench isolation interposed at the boundary of an n-well conductive region and a p-well conductive region, a first intra-well isolation structure having a first isolation trench depth, the first intra-well isolation structure interposed between a pair of p-channel transistors residing in the n-well region, and a second intra-well isolation structure having a second isolation trench depth, the second intra-well isolation structure interposed between a pair of n-channel transistors residing in the p-well region.

6 Claims, 6 Drawing Sheets

DUAL DEPTH TRENCH ISOLATION

FIELD OF THE INVENTION

This invention relates to semiconductor fabrication processing and, more particularly, to a Complimentary Metal Oxide Semiconductor (CMOS) fabrication method for forming dual depth trench isolation for inter-well regions in semiconductor devices, such as semiconductor memory devices.

BACKGROUND OF THE INVENTION

A current trend in the fabrication of CMOS devices is to use various techniques, known in the industry as "shrinks," to reduce the size of the device and thus enable fabrication of a greater number of devices per each semiconductor wafer or other substrate. The rapid numbers of shrinks a given device may go through presents several challenges. Some of those challenges involve isolation between intra-well and inter-well isolation regions. Intra-well isolation is defined as the isolation between similarly doped field effect transistors. For example, n-channel field effect transistors (FETs) that reside within a common p-well region must be isolated from each other so that there is minimal interaction between the neighboring FETs. Likewise, isolation is needed between p-channel FETs that reside in a common n-well region.

Inter-well isolation is defined as the isolation between similar type dopants of a FET and a neighboring conductively doped region. For example, n-channel FETs that reside close to a neighboring n-well region require sufficient isolation to minimize the leakage current between the n-channel devices and the neighboring n-well region, that will result in isolation breakdown. Likewise, isolation is required for p-channel FETs that reside close to a neighboring p-well region.

Due to rapidly shrinking die sizes of devices, the spacing allowed for intra-well and inter-well isolation is becoming increasingly tight. The present invention provides sufficient inter-well and intra-well isolation for CMOS devices.

SUMMARY OF THE INVENTION

Exemplary implementations of the present invention comprise processes for forming dual depth trench isolation for inter-well and intra-well isolation regions in a semiconductor memory device.

An exemplary implementation of the present invention discloses a dual depth trench isolation structure formed between active devices and conductive well regions of same conductivity type for a complimentary metal oxide semiconductor device. The inter-well isolation structure comprises a stepped structure where an overlying step is wider than underlying step and the underlying step is longer (deeper) than the overlying step. The dual depth trench isolation is interposed at the boundary of an n-well conductive region and a p-well conductive region.

Additionally, the first exemplary implementation of the present invention may include a first intra-well isolation structure interposed between a pair of p-channel transistors residing in the n-well region, and a second intra-well isolation structure interposed between a pair of n-channel transistors residing in the p-well region. Each intra-well isolation structure has substantially the same length (depth) as the depth of the overlying step of the inter-well isolation.

Another exemplary implementation of the present invention teaches process steps to form variations of a dual depth trench isolation structure. On exemplary process comprises, etching an inter-well trench to a first inter-well trench depth, into a conductively doped portion of a semiconductor assembly, followed by etching intra-well trenches to an intra-well trench depth on opposing sides of the inter-well trench, while simultaneously etching the inter-well trench to a second inter-well trench depth. Isolation material is then formed in the intra-well and inter-well trenches. Conductive wells that have a common boundary, but have opposite conductivity type, are formed within the conductively doped region and the isolation material is interposed at the common boundary of the conductive wells. The conductive wells (typically p-type and n-type) can be formed either before or after the isolation structures are formed. During the etching of the second inter-well trench it is preferred to consume a portion of each conductive well at their common boundary.

In yet another exemplary implementation of the present invention, the intra-wells and inter-well isolation structures are formed by a multilevel photoresist pattern with a first level defining active areas within a silicon substrate, a second level defining each intra-well width and depth, a first inter-well width and a first inter-well depth, and a third level defining a second inter-well width and a second inter-well depth. An etch step is performed that transfers the multilevel photoresist pattern to the underlying silicon substrate to form the final inter-well trench, as well as the intra-well trenches. Isolation material is then formed into the trenches to form the final inter-well and intra-well isolation structures. The conductive wells are formed as indicated previously.

The formation of the multilevel photoresist pattern comprises using gradient photolithography to impose a gradient exposure on the photoresist material or by using masks in succession to form the desired levels of the photoresist pattern.

BRIEF DESCRIPTION OF THE DRAWINGS

FIG. 13 is a cross-sectional view depicting a semiconductor substrate after the formation of blanket layers of oxide and nitride followed by a p-type conductive dopant implant.

FIG. 14 is a cross-sectional view of the structure of FIG. 13 taken after the formation and patterning of a mask, formed by gradient photolithography, to define intra-well and inter-well isolation locations.

FIG. 15 is a cross-sectional view of the structure of FIG. 14 taken after an etch is performed to create intra-well and inter-well trenches.

DETAILED DESCRIPTION OF THE INVENTION

Exemplary implementations of the present invention directed to processes for forming dual depth trench isolation between n-channel active devices and n-well regions and p-channel active devices and p-well regions in a semiconductor assembly, such as a memory device, are depicted in FIGS. 1–15.

Figure 1:
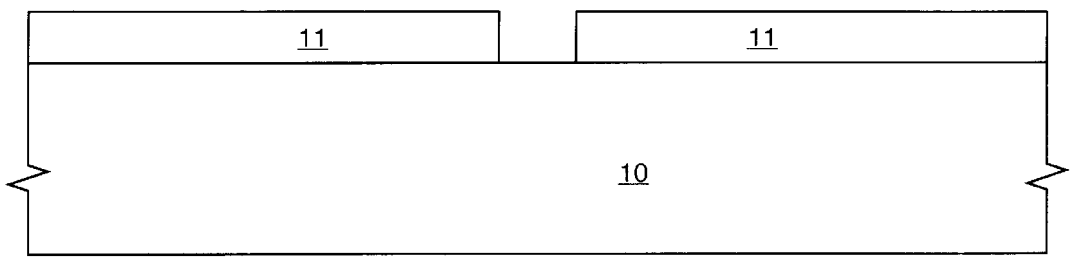
FIG. 1 is a cross-sectional view depicting a semiconductor substrate after the formation of a mask required to define alignment marks and desired portions of inter-well isolation locations.

A first exemplary implementation of the present invention is depicted in FIGS. 1–12 and referring now to FIG. 1, a wafer substrate 10 is prepared for semiconductor fabrication. During the formation of the alignment marks (combis) for the wafer, additional mask openings are formed at desired locations to create predefined partial regions for isolation between p+ and n+ (hereinafter defined as inter-well isolation) locations on each semiconductor device (only partial portions of the inter-well isolation are defined at this point). FIG. 1 represents one such desired location to fabricate the isolation of the present invention. Mask 11 provides an opening to define a desired portion of a future inter-well isolation location.

Figure 2:
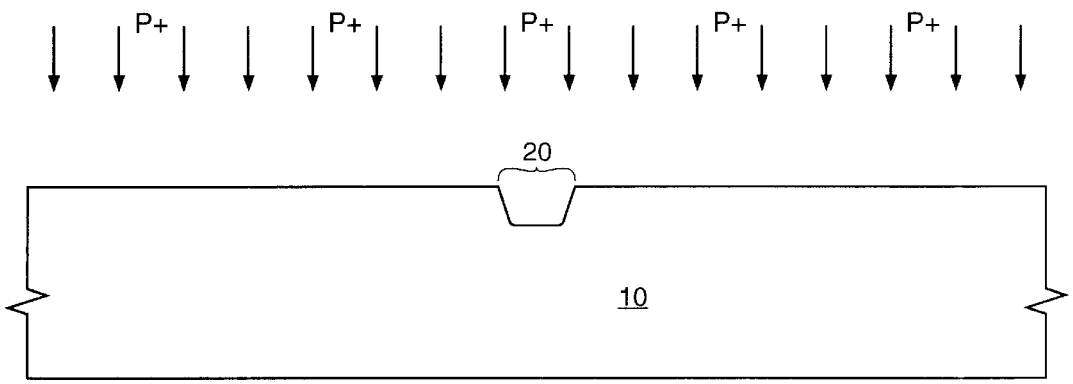
FIG. 2 is a cross-sectional view of the structure of FIG. 1 taken after an etch to form a trench for a future inter-well isolation location followed by an optional p-type conductive dopant implant.

Referring now to FIG. 2, an etch is performed to create trench 20 into substrate 10 and mask 11 (seen in FIG. 1) is removed. Next, p-type dopants, such as phosphorus or boron atoms, are implanted into substrate 10 to form a p-type substrate. It is optional to implant the p-well at this point. However, the p-well can be implanted at different times throughout the process. Regardless at which point the p-well is implanted during the process, the formation of a p-well may consist of multiple implant steps. As an exemplary implementation of the present invention, four p-well implants using boron (species B11) are used to form the p-well. A first boron implant dose comprises 5.3E12 atoms/$cm^2$ at 30K-electron Volts (KeV). A second boron implant dose comprises 1.0E12 atoms/$cm^2$ at 100 KeV. A third boron implant dose comprises 3.0E12 atoms/$cm^2$ at 180 KeV. A fourth boron implant dose comprises 1.5E12 atoms/$cm^2$ at 360 KeV. The final depth of the p-well is from 1 um to 3 um.

Figure 3:
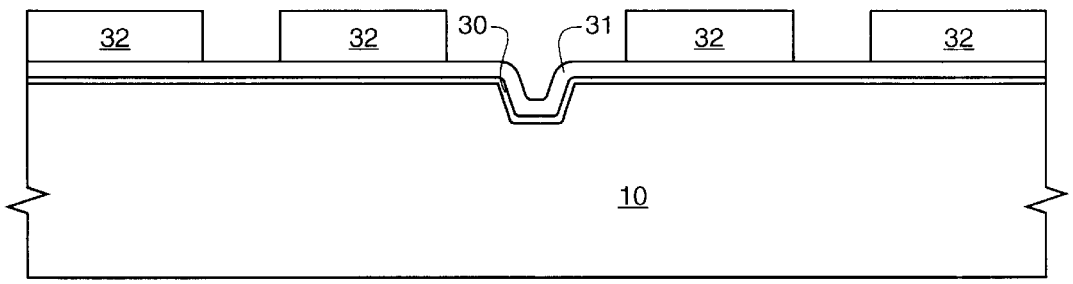
FIG. 3 is a cross-sectional view of the structure of FIG. 2 taken after the formation of blanket layers of oxide and nitride and the patterning of masks to define intra-well and inter-well isolation locations.

Referring now to FIG. 3, thin oxide layer 30 and nitride layer 31 are formed on substrate 10. Photoresist 32 is placed on nitride layer 31 and then patterned to define future n-type and p-type active areas.

Figure 4:
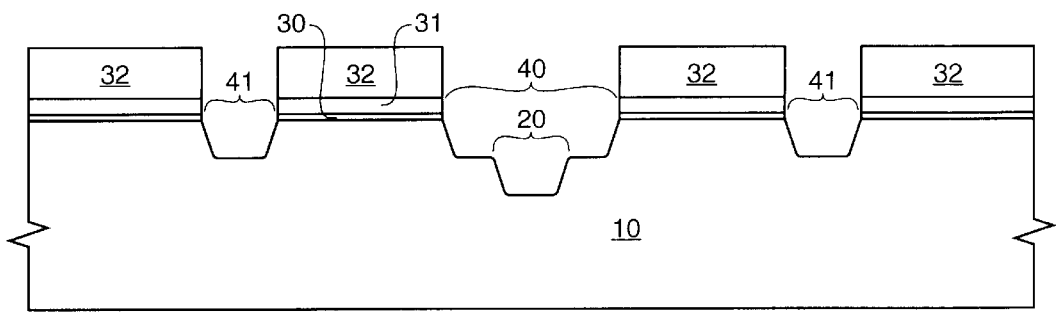
FIG. 4 is a cross-sectional view of the structure of FIG. 3 taken after an etch is performed to create intra-well and inter-well trenches.

Referring now to FIG. 4, an etch is performed to remove non-covered material comprising nitride layer 31, oxide layer 30 and substrate 10. This etch is performed for a time period sufficient to remove substrate material 10 to a desired depth. During this etch an inter-well trench 40 and intra-well trenches 41 are formed. Due to the presence of original trench 20, the central portion of the resulting inter-well trench 40 is recessed deeper into the substrate, which is a desired result as discussed later in the process. The desired depth of inter-well trench 40 will vary depending on the type of device being fabricated, but as an example, the overall depth (taken from the surface of substrate 10) would be the initial depth of trench 20 plus the depth of inter-well trench 41 with the overall depth being at least half the depth of the subsequently formed n-well.

Figure 5:
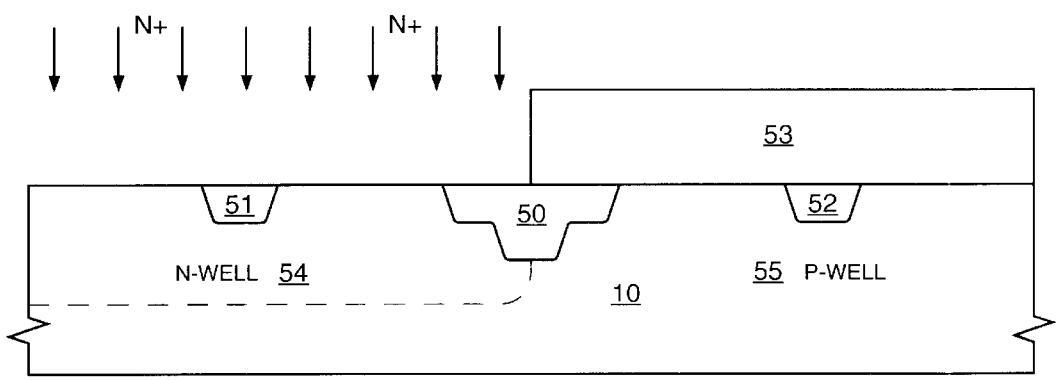
FIG. 5 is a cross-sectional view of the structure of FIG. 4 or 15 taken after the formation of intra-well and inter-well isolation followed by an n-type conductive dopant implant to form an n-well region and to define a previously implanted p-type dopant as a p-well region (n-well and p-well implants can be performed anytime during transistor formation).

Referring now to FIG. 5, the active area definition photoresist 32 (seen in FIGS. 4 and 14) is stripped and an oxide material is formed into the current recesses (intra-well trenches 41 and inter-well trench 40) present in the substrate. The oxide is then planarized to form inter-well isolation 50 and intra-well isolation 51 and 52. After the formation of inter-well isolation 50 and intra-well isolation 51 and 52, the remaining nitride layer 31 is stripped. Next, photoresist material 53 is patterned to cover a portion of substrate 10 that will later become an p-well region and to expose a portion of substrate 10 in order to form a n-well region. It is preferred that photoresist 53 be aligned near the center of inter-well isolation 50, as will be discussed later in the process.

Next, n-type dopants, such as arsenic or phosphorous atoms, are implanted into the exposed region of substrate 10 to form n-well region 54. The formation of a typical n-well may include multiple implant steps. As an exemplary implementation of the present invention, three n-well implants using phosphorous (species P31) are used to form the n-well. A first phosphorous implant dose comprises 4.0E12 atoms/$cm^2$ at 100 KeV. A second phosphorous implant dose comprises 2.4E12 atoms/$cm^2$ at 280 KeV. A third phosphorous implant dose comprises 1.5E13 atoms/$cm^2$ at 600 KeV. The final depth of the n-well is from 1 um to 2 um. This step also defines p-well region 55 that has been implanted earlier in the process.

Figure 6:
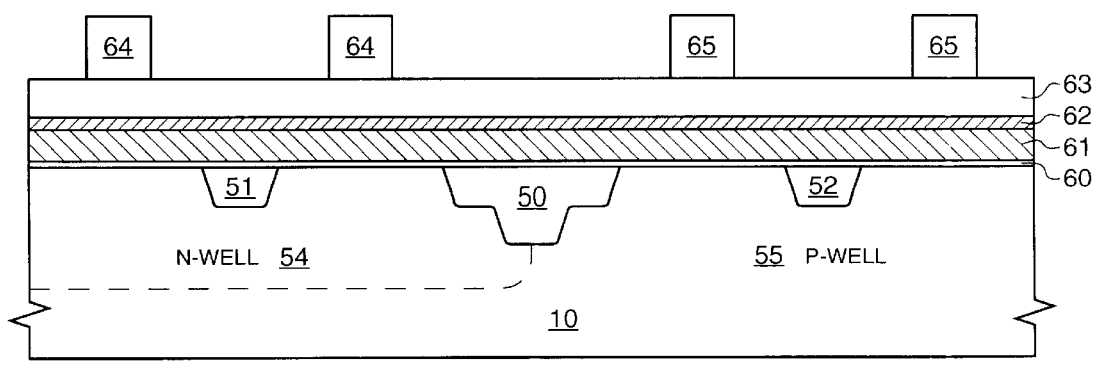
FIG. 6 is a cross-sectional view of the structure of FIG. 5 taken after the formation of blanket gate oxide, gate polysilicon, gate silicide and gate insulation and the patterning of masks to define transistor gates.

Referring now to FIG. 6, material is deposited that is patterned to form transistor gates for subsequently formed n-channel and p-channel transistor devices. The transistor gate stack is formed and made from materials such as gate oxide layer 60, Another example of a gate stack would comprise gate oxide layer 60, polysilicon layer 61, a tungsten nitride layer and tungsten layer for layer 62 and dielectric layer 63. Photoresist is patterned to form transistor gate photoresist patterns 64 and 65 at the desired locations.

Figure 7:
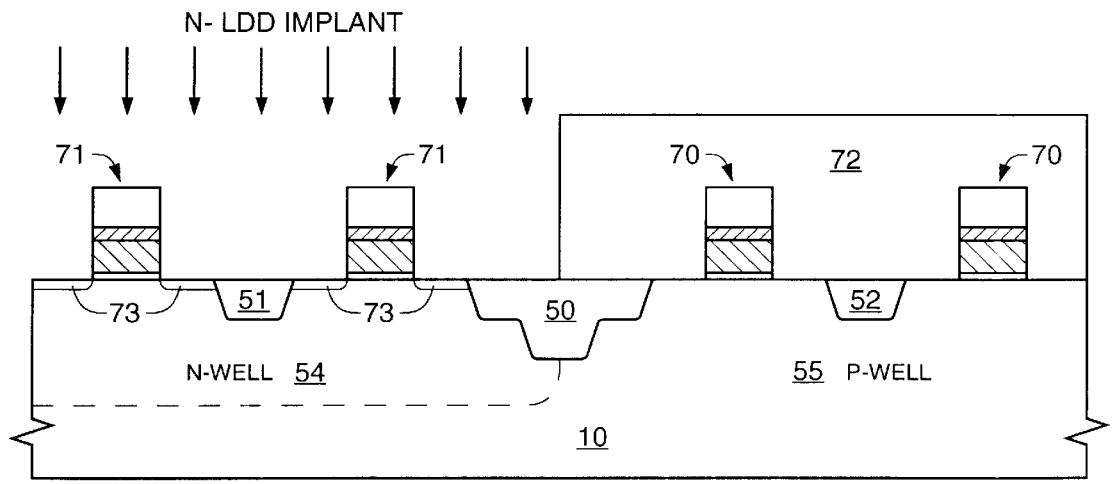
FIG. 7 is a cross-sectional view of the structure of FIG. 6 taken after an etch is performed to create transistor gates, the formation of a mask to define p-channel transistor locations and a p-type conductive dopant implant to form p-type lightly doped source/drain regions (also known as source/drain extensions or pocket implants).

Referring now to FIG. 7, an etch is performed on the transistor gate stack material to form transistor gates 70 and 71. Next, masks 64 and 65 (seen in FIG. 6) are removed followed by the formation of mask 72. Mask 72 is patterned over p-well region 55, which is followed by a n-type dopant implant (i.e., pocket implant) into the non-masked n-well region to form n-type lightly doped source/drain (LDD) regions 73. As an exemplary implementation of the present invention, the formation of a typical LDD implant may consist of an n+ implant using arsenic (species As75) with an implant dose of 2.0E12 atoms/cm² at 25 KeV.

Figure 8:
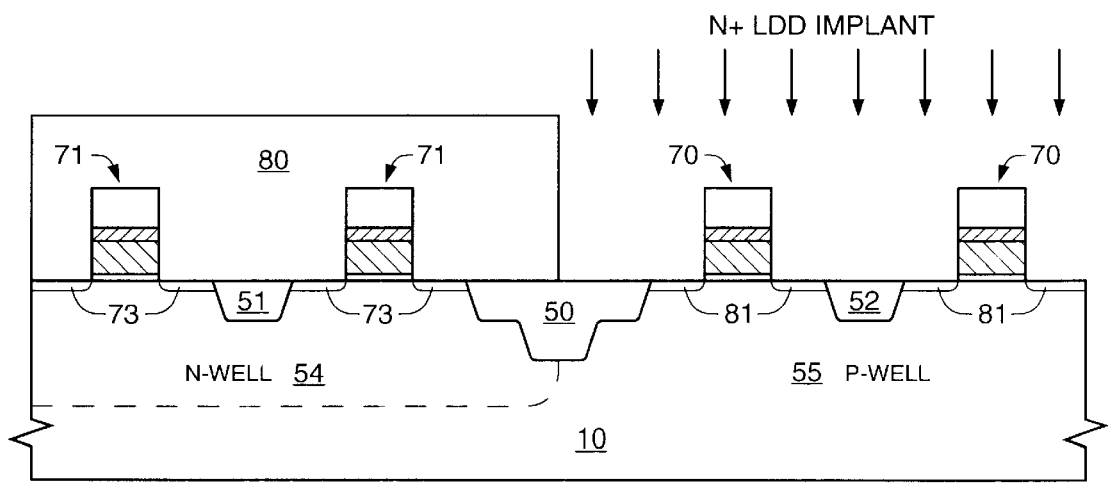
FIG. 8 is a cross-sectional view of the structure of FIG. 7 taken after the formation of a mask to define n-channel transistor locations followed by an n-type conductive dopant implant to form n-type lightly doped source/drain regions (also known as source/drain extensions or pocket implants).

Referring now to FIG. 8, mask 72 (seen in FIG. 7) is removed and mask 80 is patterned over n-well region 54, which is followed by an n-type dopant implant (i.e., pocket implant) into the non-masked p-well region 55 to form n-type lightly doped source/drain (LDD) regions 81. As an exemplary implementation of the present invention, the formation of a typical n-type LDD implant may consist of a n+ implant using arsenic (species As75) with an implant dose of 2.0E12 atoms/cm² at 25 KeV. If so desired the LDD implants can be performed simultaneously in both the p-channel and n-channel devices.

Figure 9:
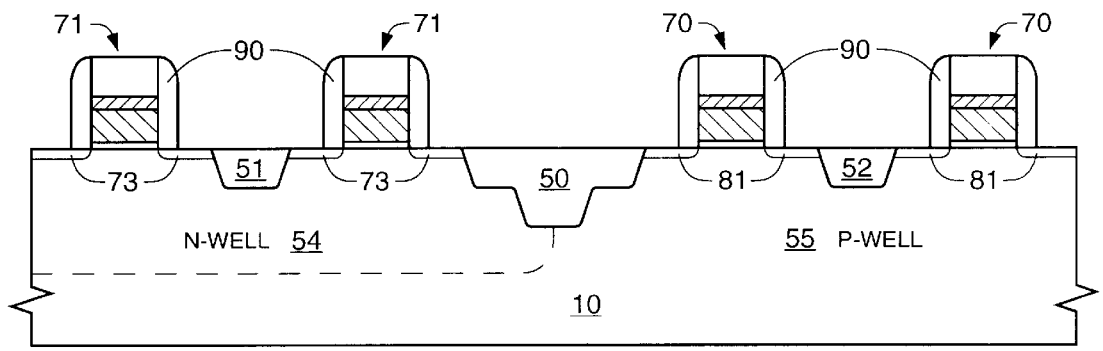
FIG. 9 is a cross-sectional view of the structure of FIG. 8 taken after the formation of a blanket layer of oxide, followed by a spacer etch to form transistor gate spacers.

Referring now to FIG. 9, mask 80 (seen in FIG. 8) is removed and an oxide layer is formed over the semiconductor assembly, which includes the p-channel devices, the n-channel devices, intra-well isolation 51 and 52 and inter-well isolation 50. A spacer etch is performed on the oxide layer to form oxide transistor gate spacers 90. If so desired, the oxide layer may be replaced with a nitride layer in order to form nitride transistor gate spacers 90.

Figure 10:
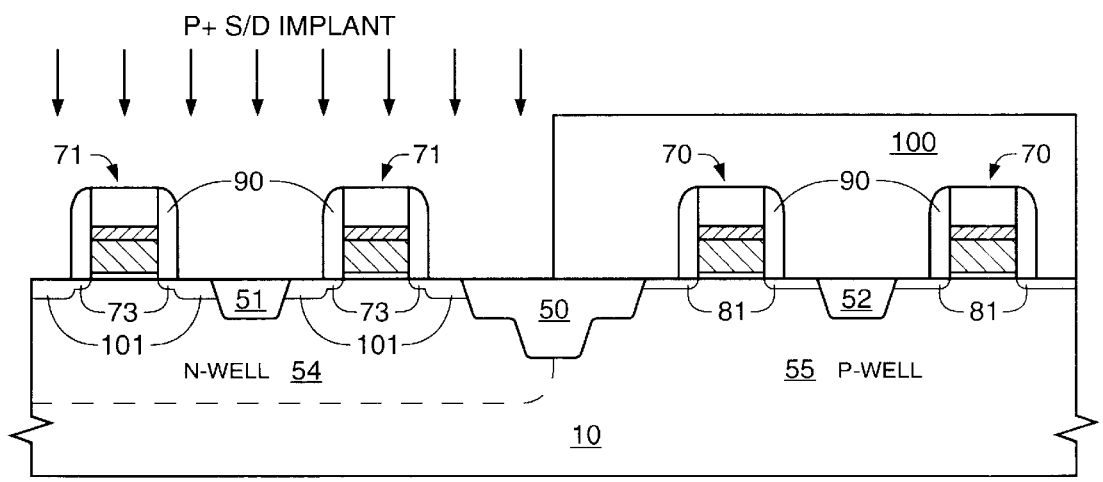
FIG. 10 is a cross-sectional view of the structure of FIG. 9 taken after the formation of a mask to define p-channel transistor locations and a p-type conductive dopant implant to form p-type doped source/drain regions.

Referring now to FIG. 10, mask 100 is patterned over p-well region 55, which is followed by an p-type dopant implant into the non-masked n-well region 54 to form p-type doped source/drain regions 101. As an exemplary implementation of the present invention, the formation of a typical p-type source/drain may consist of a p+ implant using boron (species BF249) with an implant dose of 1.5E15 atoms/cm² at 10 KeV.

Figure 11:
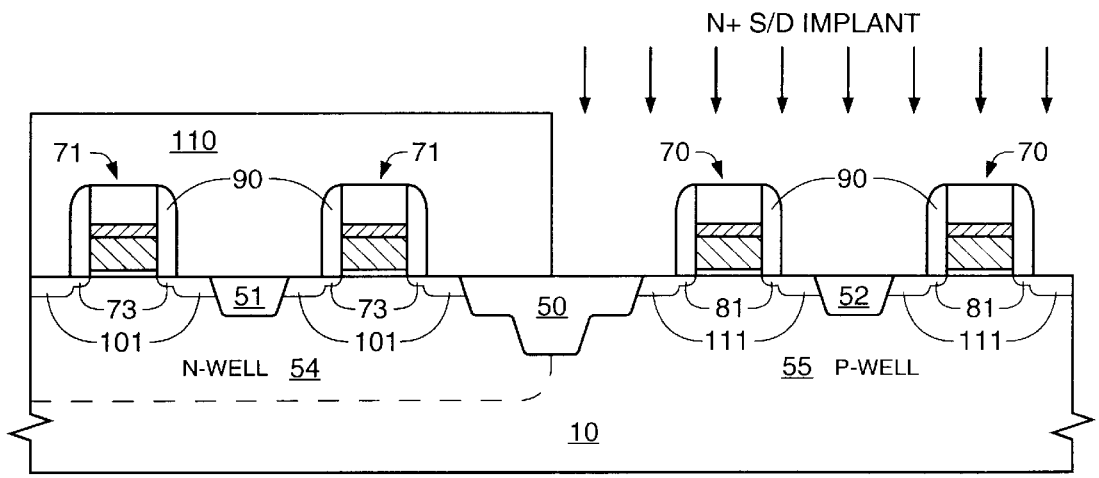
FIG. 11 is a cross-sectional view of the structure of FIG. 10 taken after the formation of a mask to define n-channel transistor locations and an n-type conductive dopant implant to form n-type doped source/drain regions.

Referring now to FIG. 11, mask 100 (seen in FIG. 10) is removed and mask 110 is patterned over n-well region 54, which is followed by an n-type dopant implant into the non-masked p-well region 55 to form n-type doped source/drain regions 111. As an exemplary implementation of the present invention, the formation of a typical n-type source/drain may consist of a n+ implant using arsenic (species As75) with an implant dose of 2.0E15 atoms/cm² at 20 KeV.

Figure 12:
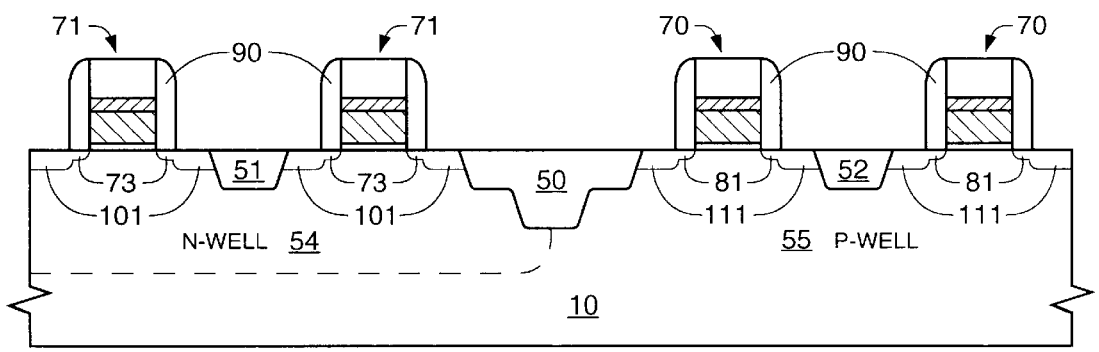
FIG. 12 is a cross-sectional view of the structure of FIG. 11 depicting p-channel and n-channel transistors separated by inter-well isolation and intra-well isolation structures.

Referring now to FIG. 12, the final inter-well isolation structure 50 and intra-well isolation structures 51 are shown in their completed form. Inter-well isolation structure 50 provides increased isolation between p-channel transistors and neighboring p-well region, as well as increased isolation between n-channel transistors and neighboring n-well region. Isolation is provided between n+ to n-well and p+ to p-well by reducing leakage current due to the reduction of the formation of undesirable leakage paths between opposite biased regions.

Figure 13:
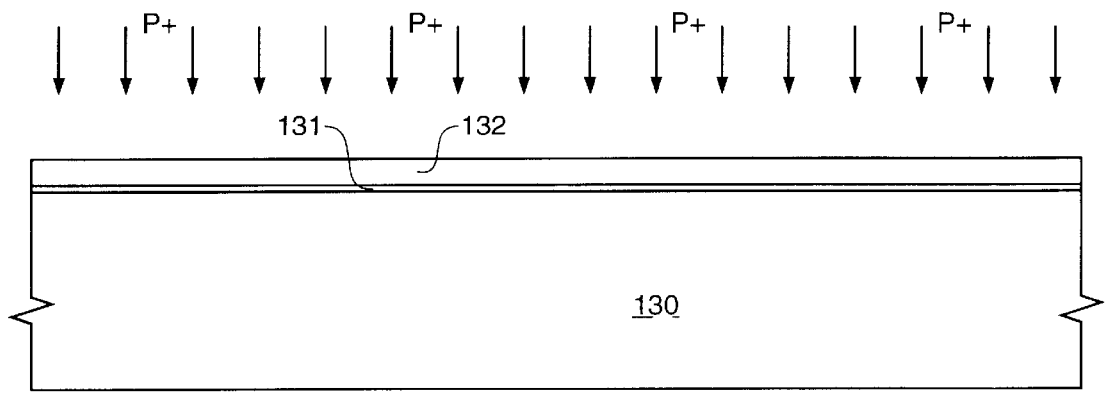
FIGS. 13–15 depict a second exemplary implementation of the present invention.
Figure 14:
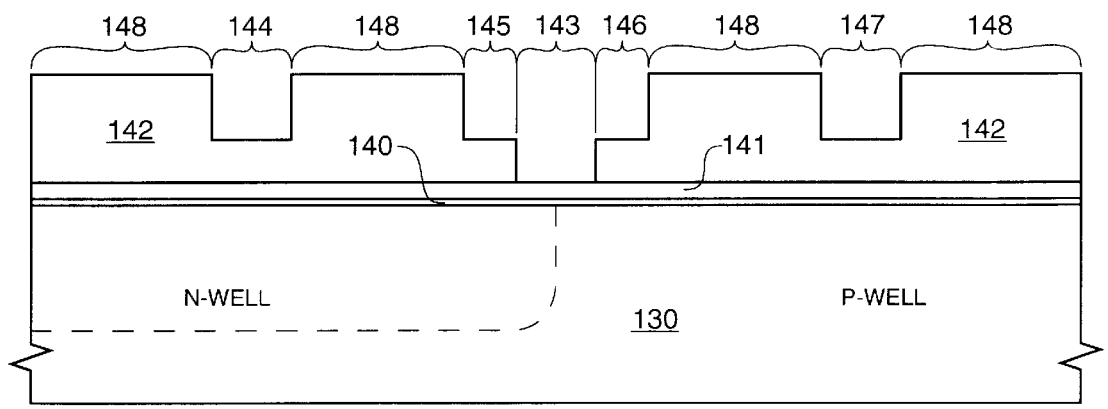
Figure 15:
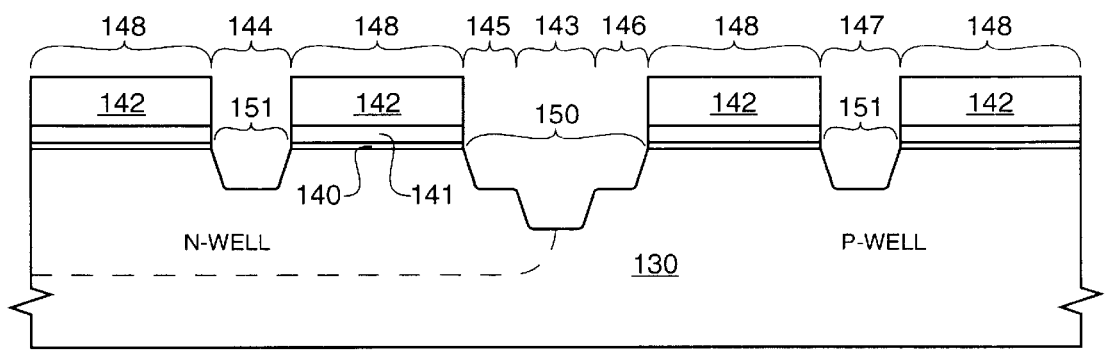

A second exemplary implementation of the present invention that combines with the process steps demonstrated in FIGS. 5–12 is depicted in FIGS. 13–15.

Referring now to FIG. 13, a wafer substrate 130 is prepared for semiconductor fabrication. Oxide layer 131 and nitride layer 132 are formed on wafer substrate 130. Next, p-type dopants, such as phosphorus or boron atoms, are implanted into wafer substrate 130 to conductively dope wafer substrate 130 as p-type.

Referring now to FIG. 14, oxide layer 140 and nitride layer 141 are formed on substrate 120. Following these layer formations, a photoresist material is placed on nitride layer 141 and patterned to define future intra-well and inter-well isolation areas. The formation of photoresist pattern 142 may be accomplished by using gradient photolithography.

Gradient photolithography imposes a gradient exposure on the photoresist material and is implemented by using a gradient (gray-scale) mask so that the exposure intensity assumes at least three levels (accomplished by varying exposure time, light intensity, and/or mask material). Alternately, the gradient exposure can be implemented using masks in succession. Regardless of how the gradient exposure is implemented, the resulting photoresist pattern 142 is created by removing substantially all of the photoresist at region 143, by leaving an intermediate depth of photoresist at locations 144, 145, 146 and 147 and by leaving a relatively thick photoresist at locations 148.

Referring now to FIG. 15, an etch is performed, using regions 145, 146 and 143, to form inter-well isolation trench 150. Due to the shape of photoresist pattern 142, the etch forms an increased trench depth that corresponds to region 143 and the etch forms intra-well isolation trenches 151 that correspond to regions 144 and 147. The structures that results from the etch performed in FIG. 15 are, in effect, equivalent to the resulting structures of FIG. 4 (of the first exemplary implementation of the present invention). For example, the intra-well trenches 151 and inter-well trench 150 of FIG. 15 are equivalent to intra-well trenches 41 and inter-well trench 40 of FIG. 4, respectively. Thus, once the structures of FIG. 15 are obtained, the process then continues with the process steps as described in FIGS. 5–11 that will eventually result in the intra-well and inter-well isolation structures depicted in FIG. 12.

The dual depth inter-well isolation that results from the exemplary implementations of the present invention, provides sufficient isolation between n+ to n-well and p+ to p-well regions.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A process for forming trench isolation in a semiconductor memory device, said process comprising the steps of:
    etching an inter-well trench to a first inter-well trench depth, into a conductively doped portion of a semiconductor assembly;
    etching intra-well trenches to an intra-well trench depth on opposing sides of said inter-well trench, while simultaneously etching said inter-well trench to a second inter-well trench depth;
    forming isolation material in said intra-well trenches and said inter-well trench;
    forming conductive wells having a common boundary at said inter-well trench but having opposite conductivity types within said conductively doped region, said isolation material interposed at said common boundary of said conductive wells.

2. The process as recited in claim 1, wherein said steps of etching an inter-well trench to a first inter-well trench depth and of simultaneously etching said inter-well trench to a second inter-well trench depth comprises etching said inter-well trench into a first and second stepped trench having said first step being wider than said second step.

3. The process as recited in claim 1, wherein said step of simultaneously etching said inter-well trench to a second inter-well trench depth comprises etching said inter-well trench to consume a portion of each said conductive well at said common boundary.

4. A process for forming trench isolation in a semiconductor memory device, said process comprising the steps of:
- etching an inter-well trench to a first inter-well trench depth, into a conductively doped portion of a semiconductor assembly;
- etching intra-well trenches to an intra-well trench depth on opposing sides of said inter-well trench, while simultaneously etching said inter-well trench to a second inter-well trench depth;
- forming isolation material in said intra-well trenches and said inter-well trench;
- forming conductive wells of opposite conductivity types having a single common boundary that forms between dopants of each conductive well at said third level within said conductively doped portion, said isolation material interposed at said common boundary of said conductive wells.

5. The process as recited in claim 4, wherein said steps of etching an inter-well trench to a first inter-well trench depth and of simultaneously etching said inter-well trench to a second inter-well trench depth comprises etching said inter-well trench into a first and second stepped trench having said first step being wider than said second step.

6. The process as recited in claim 4, wherein said step of simultaneously etching said inter-well trench to a second inter-well trench depth comprises etching said inter-well trench to consume a portion of each said conductive well at said common boundary.

* * * * *